United States Patent
Engl et al.

(10) Patent No.: US 9,174,400 B2
(45) Date of Patent: Nov. 3, 2015

(54) METHOD FOR PRODUCING STRUCTURES IN OPTOELECTRONIC COMPONENTS AND DEVICE FOR THIS PURPOSE

(75) Inventors: Karl Engl, Regensburg (DE); Berthold Hahn, Hemau (DE); Volker Härle, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1702 days.

(21) Appl. No.: 11/707,589

(22) Filed: Feb. 15, 2007

(65) Prior Publication Data

US 2007/0205525 A1  Sep. 6, 2007

Related U.S. Application Data

(60) Provisional application No. 60/773,530, filed on Feb. 15, 2006.

(30) Foreign Application Priority Data

Feb. 15, 2006  (DE) .................. 10 2006 007 222

(51) Int. Cl.
*H01L 33/22*  (2010.01)
*B29D 11/00*  (2006.01)
*B82Y 10/00*  (2011.01)
*B82Y 40/00*  (2011.01)
*G03F 7/00*  (2006.01)
*G03F 7/20*  (2006.01)
*H01L 31/0232*  (2014.01)

(52) U.S. Cl.
CPC ........... *B29D 11/00278* (2013.01); *B82Y 10/00* (2013.01); *B82Y 40/00* (2013.01); *G03F 7/0002* (2013.01); *G03F 7/0005* (2013.01); *G03F 7/2035* (2013.01); *H01L 31/0232* (2013.01); *H01L 33/22* (2013.01)

(58) Field of Classification Search
USPC ............................................... 438/104
See application file for complete search history.

(56) References Cited

U.S. PATENT DOCUMENTS 5,678,483 A * 10/1997 Johnson .................. 101/153
7,052,924 B2 * 5/2006 Daniels et al. ................ 438/22
7,615,179 B2 * 11/2009 Dumond et al. .......... 264/297.4

(Continued)

FOREIGN PATENT DOCUMENTS

DE  103 13 606 A1  10/2004
EP  1 473 594 A2  11/2004

(Continued)

OTHER PUBLICATIONS

Hua Tan, et al., "Roller nanoimprint lithography", J. Vac. Science Technology vol. 16, No. 6, Nov./Dec. 1998, pp. 3926-3928.

(Continued)

*Primary Examiner* — Mohammad Choudhry
(74) *Attorney, Agent, or Firm* — Cozen O'Connor (57) ABSTRACT

A method for producing structures (5) on a multiplicity of optoelectronic components (1), wherein the multiplicity of optoelectronic components (1) are arranged on an auxiliary carrier (10) and the structures (5) are produced by carrying out a movement of a first roller (15) relative to the auxiliary carrier (10) and producing the structures (5) in the process by means of exerting a pressure between the first roller (15) and the auxiliary carrier (10).

24 Claims, 4 Drawing Sheets

(56) References Cited

U.S. PATENT DOCUMENTS

| | | | |
|---|---|---|---|
| 2002/0149312 A1* | 10/2002 | Roberts et al. | 313/495 |
| 2004/0182820 A1 | 9/2004 | Motowaki et al. | |
| 2005/0258571 A1 | 11/2005 | Dumond et al. | |
| 2006/0051937 A1 | 3/2006 | Ploessl et al. | |
| 2006/0283539 A1* | 12/2006 | Slafer | 156/230 |
| 2008/0012151 A1* | 1/2008 | Kemppainen et al. | 257/786 |

FOREIGN PATENT DOCUMENTS

| | | |
|---|---|---|
| EP | 1 624 499 A2 | 2/2006 |
| WO | WO 2005/026838 A2 | 3/2005 |
| WO | WO 2006/012838 A2 | 2/2006 |

OTHER PUBLICATIONS

Schnitzer et al., "30% external quantum efficiency from surface textured, thin-film light-emitting diodes", Applied Physics Letters vol. 63, No. 16, Oct. 18, 1993, pp. 2174-2176.

* cited by examiner

METHOD FOR PRODUCING STRUCTURES IN OPTOELECTRONIC COMPONENTS AND DEVICE FOR THIS PURPOSE

RELATED APPLICATIONS

This application claims priority from U.S. Provisional Patent Application Ser. No. 60/773,530 filed on Feb. 15, 2006 and German Patent Application no. 10 2006 007 222.7 filed Feb. 15, 2006. The contents of both are hereby incorporated herein by reference.

FIELD OF THE INVENTION

The present invention is directed to a method for producing structures on a multiplicity of optoelectronic components, and a device for this purpose.

BACKGROUND OF THE INVENTION

The publication "Roller nanoimprint lithography" (J. Vac. Sci. Technol. B 16 (6), 1998, pages 3926 to 3928) discloses an embossing method, a so-called roller nanoimprint method, in which a photoresist situated on a substrate is patterned by means of a roller running over the substrate.

SUMMARY OF THE INVENTION

One object of the present invention is to produce structures on a multiplicity of optoelectronic components.

This and other objects are attained in accordance with one aspect of the present invention directed to a method for producing structures on a multiplicity of optoelectronic components. The multiplicity of optoelectronic components are arranged on an auxiliary carrier. The structures are produced by carrying out a relative movement of a first roller relative to the auxiliary carrier, then exerting a pressure between the first roller and the auxiliary carrier.

In this case, the first roller can move over an auxiliary carrier held in stationary fashion, or the position of the first roller is fixed and the auxiliary carrier with the optoelectronic components is moved relative to the first roller past the latter. Furthermore, it is also possible that the first roller and the auxiliary carrier both move, preferably simultaneously, and the method can thereby be accelerated. In this case, it is possible that, in order to exert the pressure, the first roller is pressed against the auxiliary carrier and thus the optoelectronic components or, conversely, the auxiliary carrier with the optoelectronic components is pressed against the first roller. Furthermore, the pressure can also be exerted by means of both the roller and the auxiliary carrier, with the result that the first roller and the auxiliary carrier are pressed onto one another.

The inventors have found that an auxiliary carrier stabilizes the multiplicity of optoelectronic components, with the result that it is possible to carry out, in a particularly simple manner, a preferably continuously proceeding roller method in which the optoelectronic components on the auxiliary carrier are led past the first roller.

By way of example, a flexible first film may advantageously be used as the auxiliary carrier. A flexible first film makes it possible, for example, in a continuous method, to produce the structures in the multiplicity of optoelectronic components arranged on the auxiliary carrier, without carrying out a complicated alignment.

In a further embodiment of a method according to the invention, by means of the relative movement of the first roller relative to the auxiliary carrier, a stamp is pressed onto the optoelectronic components and the structures are produced thereby. The stamp may be present on the first roller, for example, with the result that when a pressure is exerted between the roller and the optoelectronic components arranged on the auxiliary carrier, the structures are then produced on the optoelectronic components by means of embossing.

As an alternative, it is possible to use in addition to the first film, on which the optoelectronic components are arranged, a second film, on which the stamp is arranged as a patterned layer, for example. In a method of this type, the structures can then be produced in the optoelectronic components by means of a relative movement of the first roller with respect to the second film, too, and exerting a pressure between the first roller, the second film and the auxiliary carrier.

Figure 1:
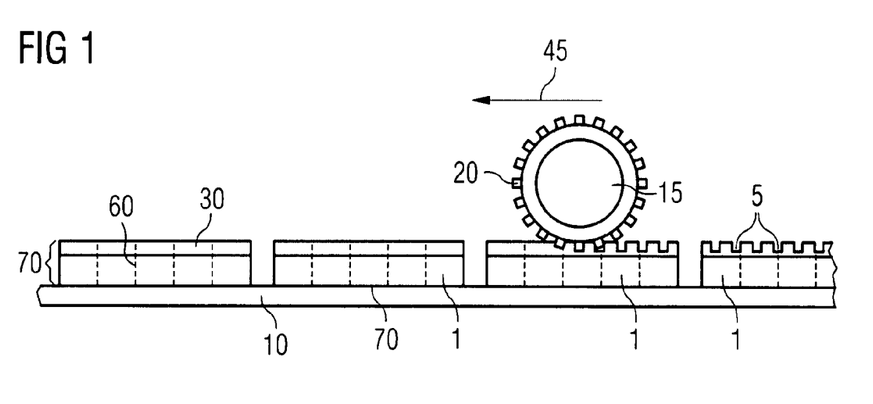
FIG. 1 is a cross-sectional drawing of an arrangement to implement one embodiment of a method according to the invention, in which the stamp is present on the roller.
Figure 2:
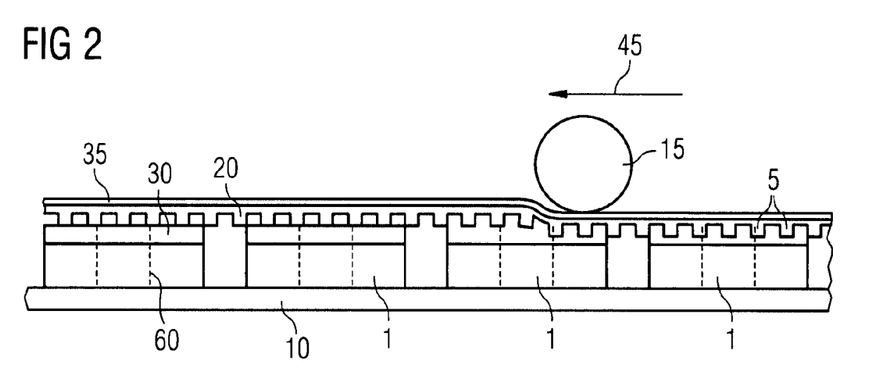
FIG. 2 shows in cross section a further arrangement to implement an embodiment of a method according to the invention, in which the stamp is present on a second film.

In this case, the structures of the stamp which are arranged either on the first roller or on the second film are advantageously complementary to the structures to be produced on the optoelectronic components (see FIGS. 1 and 2, for example).

The structures in the multiplicity of optoelectronic components can be produced in a particularly simple manner, for example, by means of a lithographic method using optoelectronic components which have a photoresist layer arranged on their surface. The structures can then be produced in the photoresist layer by means of the abovementioned relative movement of the first roller with respect to the auxiliary carrier. It is particularly advantageous if said structures in the photoresist layer are subsequently transferred into the optoelectronic components, for example by means of etching with the aid of reactive plasmas.

In a further embodiment of a method according to the invention, at the same time as the production of the structures in the photoresist layer, said structures are cured. Immediate curing of the structures directly during or after their formation by means of embossing by a stamp increases the stability of said structures and prevents a deformation of the photoresist after the patterning e.g. on account of deliquescence of the photoresist. The structures are particularly advantageously cured by exposure. In such a case, it is particularly favourable if a first roller is used which is transparent to the light used during the exposure. In this case, during the patterning by means of the first roller, the structures currently being produced by embossing in the multiplicity of optoelectronic components can then be exposed via the first roller.

By way of example, a first roller may be used which has arranged on its surface coupling-out structures for coupling out the light used during the exposure. Said coupling-out structures may be cylindrical, polygonal e.g. square or circular depressions. In this case, it is possible to couple out the light used for the exposure from the first roller for example by virtue of the fact that when the roller is in contact with the photoresist layers or the optoelectronic components, a change in refractive index results, which is used for coupling out the light.

In the case where an exposure of a patterned photoresist is necessary, it is also possible for a first roller to be used in which an exposure unit for the exposure is already integrated. This has the advantage that the light is generated directly in the first roller and is coupled out from the latter and acts on the structures currently being produced by means of the embossing in the photoresist layer. Consequently, it is not necessary for the light first to be coupled into the first roller externally, which is generally always associated with losses.

Furthermore, it is possible for the regions of the photoresist layer which are currently being patterned to be heated in order to keep said regions somewhat more flowable and thus to facilitate the embossing of the structures by means of the stamp, reducing the risk of the photoresist layer tearing. For this purpose, a heating device may be present e.g. in a manner integrated in the first roller or separately therefrom, which heating device heats the regions to be patterned. It is particularly advantageous if the heating device is connected upstream of the roller and, consequently, the regions to be patterned are firstly heated and then patterned by means of the roller.

In a further embodiment of a method according to the invention, a second film may be used, on which the structures that are intended to be produced on the optoelectronic components are arranged in a patterned layer. By means of relative movement of the roller with respect to the auxiliary carrier, on which the multiplicity of optoelectronic components is arranged, the patterned layer with the structures is then transferred to the optoelectronic components by means of exerting a pressure. Any desired bonding method may be used in this case. Consequently, in a method of this type, no stamp is required for embossing the structures in the optoelectronic components, rather the structures already present are transferred to the optoelectronic components (see FIG. 5, for example).

In a further embodiment of a method according to the invention, a second roller alongside the first roller may be used, which is likewise moved relative to the auxiliary carrier, in which case the second roller is arranged relative to the first roller such that the auxiliary carrier with the optoelectronic components and the stamp or the third film with the structures to be transferred are led through and pressed through between the first and second roller. In such an embodiment of a method according to the invention, the auxiliary carrier with the optoelectronic components and the stamp or the third film with the structures to be transferred are particularly advantageously fixed between the first and second roller (see FIGS. 3 and 4, for example). In this case, the first and second rollers can be pressed against one another, with the result that the pressure required for producing the structures can be built up in a particularly simple manner.

Both rollers, or, if only the first roller is present, just the latter, may be flexible and thus permit structures to be produced particularly simply.

By way of example, coupling-out structures for the radiation emitted by the components may be produced as the structures on the plurality of optoelectronic components in the case where the structures are produced on radiation-emitting optoelectronic components. In this case, by way of example, photonic crystals may be produced as coupling-out structures on the optoelectronic components. It is thus possible, for example, to produce a multiplicity of depressions on the surfaces of the optoelectronic components by means of embossing or transferring of the structures. Said depressions may be delimited by elevations, with the result that under certain circumstances regular arrangement of depressions and elevations can be produced on the surface of the optoelectronic components (see FIG. 6, for example). In order to produce a photonic crystal, the depressions are then advantageously filled with a material, preferably a dielectric material, which has a refractive index that is different from the refractive index of the elevations, which are composed of a semiconductor material, by way of example. Consequently, on the surface of the optoelectronic components, it is possible to produce an alternating arrangement of first regions having a first refractive index and second regions having a second refractive index, different from the first refractive index, which can be arranged regularly or else non-symmetrically.

This arrangement may have for example the structure of a two-dimensional grating, the distance between adjacent elevations being adapted approximately to the wavelength of the radiation generated by the optoelectronic component which is intended to be coupled out from the component. Depressions may be filled with a dielectric, for example, whose refractive index differs from the elevations. However, it also possible for the depressions not to be filled, with the result that only e.g. air is situated in said depressions. The depressions or structures which are produced by means of the embossing with the aid of the stamp or the transferring of the structures on the optoelectronic components may assume any desired form in this case. The directional emission of the light can also be improved by the photonic crystal.

Figure 6:
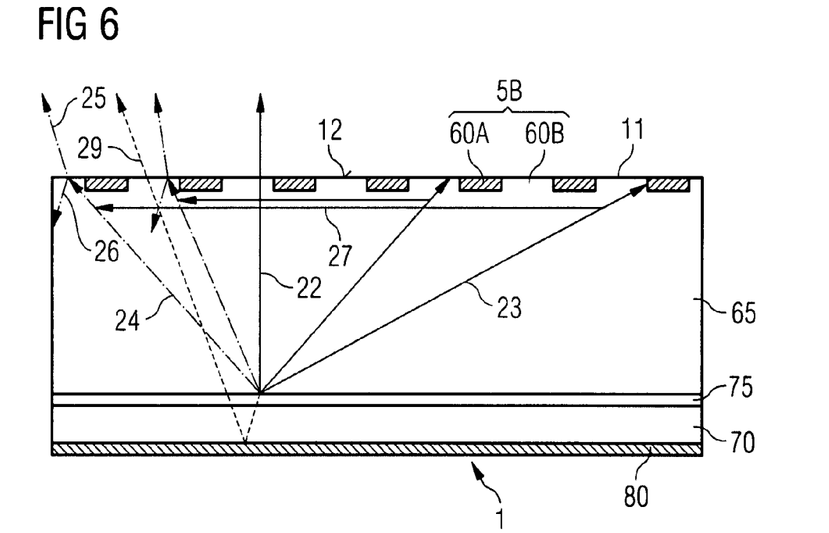
FIG. 6 schematically shows in cross section a thin-film light-emitting diode with a photonic crystal that can be produced by means of the method embodiments according to the invention.

Optoelectronic components on which the structures are produced by means of the methods according to the invention may advantageously in each case have an active layer provided for generating the radiation which are arranged between a first and a second semiconductor layer, in which case the structures are produced as light coupling-out structures such that they are arranged in the beam path of the respective components (see FIG. 6, for example). In this case, the first semiconductor layer may be p-conducting, for example, and the second semiconductor layer may preferably be n-conducting. If a current is then sent through the first and second semiconductor layers in the transmission direction, electrons and "holes" recombine in the region of the active layer, in which case the energy liberated can be emitted in the form of radiation.

Particularly advantageously, thin-film semiconductor bodies or thin-film light-emitting diodes can be provided with structures by means of the methods according to the invention.

Thin-film light-emitting diodes are distinguished by features such as the following:

a reflective layer is applied or formed at a first main area of a radiation-generating epitaxial layer sequence that faces a carrier element, which reflective layer reflects at least part of the electromagnetic radiation generated in the epitaxial layer sequence back into the latter, and the epitaxial layer sequence contains at least one semiconductor layer with at least one area having an intermixing structure that ideally leads to an approximately ergodic distribution of the light in the epitaxial layer sequence, that is to say that it has an as far as possible ergodic stochastic scattering behavior.

The principle of a thin-film light-emitting diode is described for example in I. Schnitzer et al., Appl. Phys. Lett. 63 (16), 18 Oct. 1993, 2174-2176, the disclosure content of which in this respect is hereby incorporated by reference.

A thin-film light-emitting diode is to a good approximation a Lambert surface radiator and is therefore particularly well suited to the application in a headlight.

The epitaxial layer sequence advantageously has a thickness in the region of 20 µm or less, in particular in the region of 10 µm.

The structures to be produced can be produced particularly well as nanostructures by the methods according to the invention. Nanostructures have extents of approximately 30 to 1000 nm, preferably of 80 to 800 nm, more preferably 80 to 200 nm. Consequently, said structures are significantly smaller than the extents of the individual optoelectronic components, which are often of the order of magnitude of 200 µm to 1000 µm.

Due to the large difference in size between the nanostructures produced and the optoelectronic components on which the nanostructures are to be arranged (difference in dimensions 1:10) the nanostructures do not have to be precisely aligned onto the optoelectronic in order to perform their function. For example, in the case that the nanostructures are part of light outcoupling structures, which form a pattern of first and second regions having a differing refractive index, the nanostructures have to be arranged on the optoelectronic component in order to work as part of the light outcoupling structures, but they do not have to be aligned in a certain horizontal way relative to the optoelectronic component because due to the large size difference, there is always a large number of nanostructures (or first and second regions having a differing refractive index) arranged on one particular optoelectronic component. Due to that the light outcoupling efficiency out of the optoelectronic component is enhanced regardless of the exact horizontal alignment of the light outcoupling structures relative to the optoelectronic component.

In the case where light coupling-out structures are produced as structures on the optoelectronic components, the individual structures preferably have extents of 80 to 120 nm if blue light is intended to be coupled out, or extents of 150 to 200 nm if green light is intended to be coupled out.

In a further embodiment of a method according to the invention, the multiplicity of optoelectronic components to be patterned are part of a larger contiguous wafer assemblage which, after the patterning and the possible application of bonding connections, still has to be singulated to form the respective individual optoelectronic components (see, for example, singulation lines in FIG. 1).

In a further embodiment, the invention relates to a device for photolithographically producing structures in a multiplicity of optoelectronic components arranged on an auxiliary carrier, comprising an exposure unit for the exposure of a photoresist, a first roller, which is transparent to the radiation emitted by the exposure unit., a transporting unit for conveying an auxiliary carrier, and a positioning unit for the relative orientation of the first roller and the transporting unit with respect to one another.

In a device of this type, the exposure unit can therefore emit light, in which case the first roller is transparent to said light and may therefore serve directly for directing light for the exposure of the photoresist during the patterning through the roller onto the structures currently being formed.

The exposure unit is advantageously integrated in the first roller. However, the exposure unit may also constitute a functional unit which is separate from the first roller and which is arranged e.g. outside the first roller.

Furthermore, in a further embodiment, the device comprises a transporting unit for conveying the auxiliary carrier to the first roller, in which case the transporting unit may be, for example, a belt for transporting the auxiliary carrier to the first roller.

A belt of this type may not only transport the auxiliary carrier with the optoelectronic components arranged thereon to the roller, but also simultaneously stabilize the auxiliary carrier with the optoelectronic components, with the result that it is possible to build up a pressure between the roller and the optoelectronic components either for embossing the structures or for transferring the structures from the third film.

The positioning unit may be e.g. a motor which serves e.g. to orient the roller above the belt. The belt serves as the transporting unit. The positioning unit may furthermore be configured in such a way that the first roller can exert a pressure on the transporting unit and the pressure required for producing the structures is built up in this way.

Furthermore, a device of this type may be equipped with an additional second roller, which is arranged relative to the first roller such that the transporting unit and therefore then also the auxiliary carrier which is situated thereon with the optoelectronic components can be led through between both rollers by means of the positioning unit.

In further embodiments, the device may also comprise a heating device, which e.g. either is integrated in the first or second roller, or is connected upstream of said rollers. Said heating device can heat the photoresist layers of the optoelectronic components situated on the transporting unit and thus make them flexible enough for the embossing operation by means of the stamp. The heating device may be connected upstream of the rollers or the first roller and, therefore, be positioned before the rollers or the first roller in the direction of movement of the transporting unit.

BRIEF DESCRIPTION OF THE DRAWINGS

The invention will be explained in even more detail below on the basis of exemplary embodiments and figures. The figures are schematic illustrations that are not true to scale.

DETAILED DESCRIPTION OF THE DRAWINGS

FIG. 1 shows in cross section a first roller 15, on which there is a stamp 20 with protrusions, which is moved in the direction of the arrow 45 over the optoelectronic components 1 arranged on an auxiliary carrier 10. In this case, the stamp 20 of the roller 15 presses into photoresist layers 30 arranged on the optoelectronic components. In this case, by means of the pressing of the stamp 20, depressions can be produced as the structures 5, which are in each case flanked by elevations. It can be seen that a plurality of wafer assemblages 70 can be arranged on the auxiliary carrier 10, e.g. a film, said wafer assemblages in each case comprising a plurality of individual components. After the production of the structures, said individual components can be singulated along the singulation lines 60 by means of a laser method, by way of example.

FIG. 2 shows a further embodiment of the invention, in which case, in contrast to FIG. 1, this time the stamp 20 is arranged on a second film 35 and not on the first roller 15. It can be seen that the roller 15 is again pressed in the direction of the arrow 45 onto the second film 35 with the stamp 20, which thereby produces the structures 5 in the photoresist layers 30 of the optoelectronic components 1 by means of embossing. As already shown in FIG. 1, the optoelectronic components are again arranged in so-called wafer assemblages, in which case the individual components can be singulated by means of singulation along the singulation lines 60 after patterning.

Figure 3:
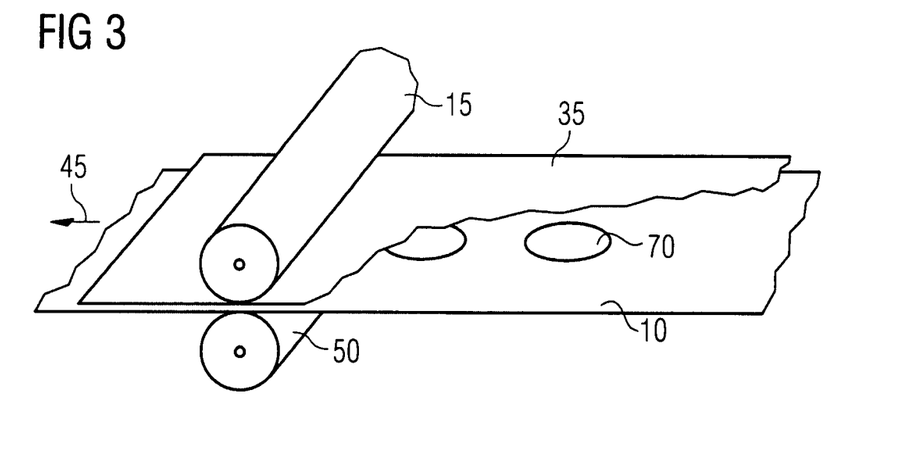
FIGS. 3 and 4 show different arrangements to implement embodiments of methods according to the invention with two rollers.
Figure 4:
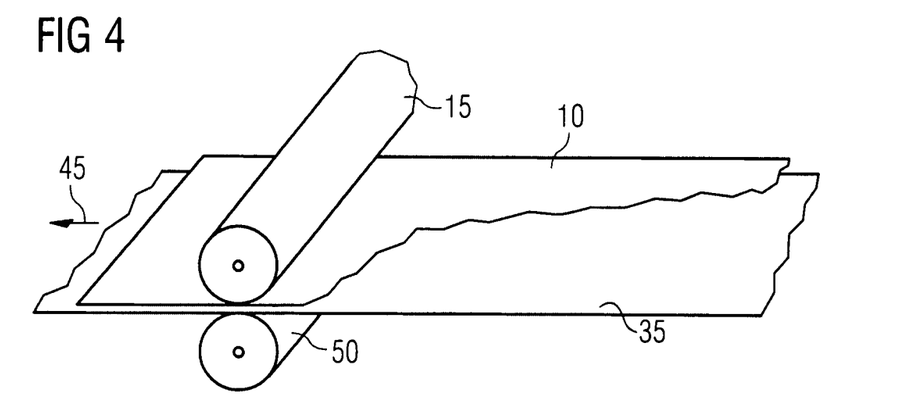

FIG. 3 shows an embodiment of the method according to the invention in which a first roller 15 and a second roller 50 are used and, between said rollers, an arrangement comprising the auxiliary carrier 10 with the wafers 70 situated thereon together with the second film 35, which has the stamp, are drawn through the two rollers in the direction of the arrow 45. In this perspective drawing, the stamp on the second film 35 and the photoresist layers on the wafers 70 cannot be seen, for reasons of clarity. In this case, the first roller 15 may also have an integrated exposure unit for the exposure of photoresist materials. In contrast to FIG. 3, the order of the second film 35 and the auxiliary carrier 10 is interchanged in the case of the arrangement in FIG. 4. In this case, the second roller 50 contains an integrated exposure unit for the exposure of the resist materials on the optoelectronic components of the wafers.

Figure 5:
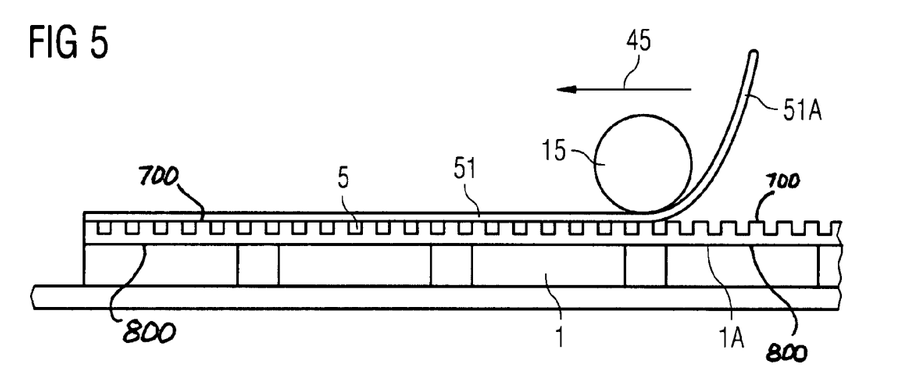
FIG. 5 shows in cross section an arrangement to implement a further embodiment of a method according to the invention in which the structures are transferred to the optoelectronic components from a third film.

FIG. 5 shows an embodiment of a method according to the invention in which no stamp is required, rather the structures 5 situated on a third film 51 are transferred to the optoelectronic components 1 arranged on the auxiliary carrier 10 by means of rolling of the first roller 15 in the direction of the arrow 45. The first roller 15 may contain e.g. a heating device for heating the third film 51, which facilitates the transfer of the structure 5 to the components 1. More specifically, as shown in FIG. 5, the structures 5 are part of a layer which is in contact with the third film 51. This can be done via a first adhesive layer 700 which attaches the layer with the structures 5 to the third film 51. Furthermore, a second adhesive layer 800 can be located on the surface of the film with the structures 5, this surface being on the side remote from the third film 51. When rolling the first roller 15, which can be heated, over the third film 51 with the structures 5, the third film being located on the optoelectronic components 1, pressure is applied between the third film 51 and the optoelectronic components 1. Due to the pressure and/or the heating, the second adhesive on the surface 800 is activated, thereby adhering the layer with the structures 5 to the optoelectronic components 1. Additionally, the adhesive on the surface 700 might be inactivated or the third film 51 might simply be peeled off. As a consequence, the layer with the structures 5 is transferred from the third film 51 onto the optoelectronic components 1. This method of transfer might be called a thermotransfer technique.

FIG. 6 schematically shows an optoelectronic component, for example a thin-film light-emitting diode 1, which can be produced by means of the method embodiments according to the invention. The structures 5 produced by means of the method embodiments according to the invention can be converted into modified structures 5B for example by filling the depressions with a dielectric material. In this case, the elevations produced by means of the embossing method or the transfer correspond to the regions 60B and the depressions correspond to the regions 60A, which have been filled with a material in the meantime, with the result that the regions 60A and 60B have different refractive indices and form for example a photonic crystal for coupling out the light generated in the thin-film light-emitting diode. In this case, this thin-film light-emitting diode has a second semiconductor layer 65 and a first semiconductor layer 70, which border an active layer 75 in which light can be generated and in which the recombination of electrons and "holes" occurs upon application of a current. The second semiconductor layer 65 is preferably n-conducting and the first semiconductor layer 70 is preferably p-conducting. A reflection layer 80 is furthermore present, which serves for reflecting the light generated in the active layer 75. Such reflection is indicated by the arrow 29, for example. The regions 60A of the photonic crystal 11 are preferably configured in cylindrical fashion, but may also assume any other desired form. In this case, the regions 60A and 60B are arranged regularly on the surface of the thin-film diode 1, with the result that a so-called two-dimensional grating is formed. However, they may also be arranged non-symmetrically in other embodiments of the invention.

The radiation 22 and 23 generated in the active layer 75 can pass directly through the second semiconductor layer 65, in which case the radiation 23 can be coupled out from the diode 1 directly via the radiation exit area 12. The portion of the radiation which impinges on the radiation exit area 12 at an angle less than the critical angle θ of total reflection can leave the thin-film light-emitting diode 1 directly. The following holds true in this case for the critical angle θ of total reflection:

$$\sin(\theta) = n2/n1,$$

where n1 is the refractive index of an optically denser semiconductor material and n2 is the refractive index of the optically less dense medium, for example air, adjoining the optically denser semiconductor. Total reflection occurs if the angle is greater than or equal to the critical angle θ of total reflection. In this case, the angles stipulated relate to the normal to the interface at the point of impingement of the light beam.

The photonic crystal 11 in this case serves to reduce the losses during the coupling-out of light by total reflection, which is shown using the example of the light beam 23. In this case, the photonic crystal 11 flips the beam 23 over by means of a flip-over process, shown on the basis of the vector 27, into a beam 24, which can then leave the thin-film light-emitting diode 1 at a critical angle less than the critical angle of total reflection. Consequently, the photonic crystal 11 can be used to reduce the coupling-out losses of the light by total reflection. The directional emission of the light can also be improved by the photonic crystal.

Figure 7:
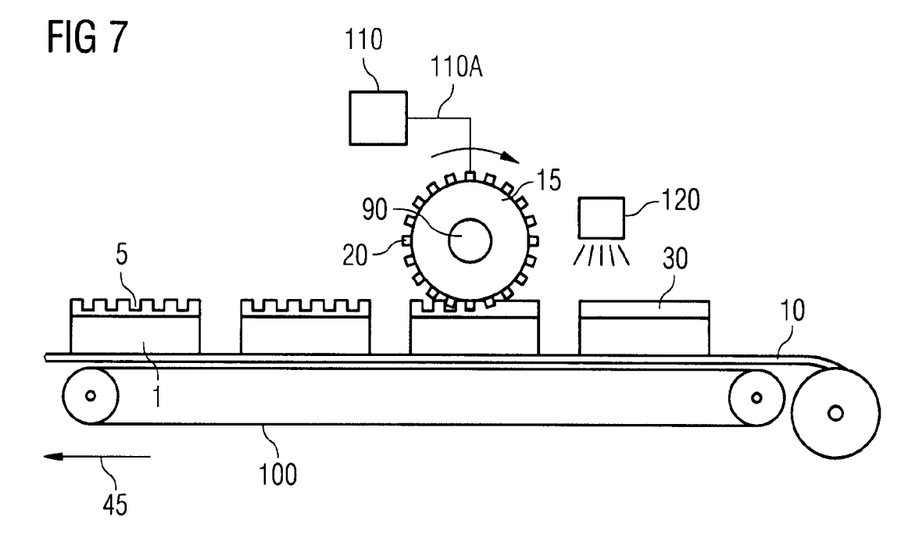
FIG. 7 schematically shows in cross section an embodiment of a device according to the invention.

FIG. 7 schematically shows in cross section an embodiment of a device according to the invention in which the optoelectronic components 1 with photoresist layers applied thereto which are arranged on the auxiliary carrier 10 are transported in the direction of the arrow 45 by means of a belt, the transporting unit 100. In this case, by means of the positioning unit 110, which may comprise e.g. a flexible and possibly also pivotable arm 110A, the first roller 15 is positioned over the photoresist layers, in which case the pressure required for embossing can also be built up in order to produce the structures 5. Furthermore, there is a heating device 120 for heating and thus flexibilizing the photoresist layers, which may be connected upstream of the first roller or else may be integrated in the first roller. An exposure unit 90 for curing the resist is also integrated into the first roller. Said exposure unit may also be positioned outside the roller. Furthermore, a second roller could also be present.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A method for producing structures on a multiplicity of optoelectronic components arranged on an auxiliary carrier, the method comprising the steps of:

providing the multiplicity of optoelectronic components, each of the optoelectronic components having an active layer comprising an optoelectronic material arranged on the auxiliary carrier before forming the structures on the multiplicity of optoelectronic components;

carrying out a relative movement between a first roller and the auxiliary carrier; and exerting a pressure between the first roller and the auxiliary carrier to form the structures on the multiplicity of optoelectronic components.

2. The method according to the claim 1, wherein a flexible first film is used as the auxiliary carrier.

3. The method according to claim 1, wherein, by means of the relative movement of the first roller relative to the auxiliary carrier, a stamp is pressed onto the optoelectronic components and the structures are produced thereby.

4. The method according to claim 3, wherein the optoelectronic components have a photoresist layer arranged on their surfaces, and the structures are produced in the photoresist layer by means of the relative movement between the first roller and the auxiliary carrier.

5. The method according to claim 4, in which the structures in the photoresist layer are transferred into the optoelectronic components.

6. The method according to claim 3, in which the stamp is arranged on a surface of the first roller.

7. The method according to claim 4, in which a second film is additionally used, on which the stamp is arranged, wherein the second film is brought into contact with the optoelectronic components or the photoresist layer by means of the relative movement and the structures are formed by impression of the stamp.

8. The method according to claim 4, wherein at the same time as the production of the structures in the photoresist layer, said structures are cured.

9. The method according to the claim 8, in which the structures are cured by an exposure to light and the first roller is transparent to the light used during the exposure.

10. The method according to claim 9, in which the first roller has arranged on its surface coupling-out structures for coupling out the light used during the exposure.

11. The method according to claim 9, in which the first roller includes an exposure unit for the exposure.

12. The method according to claim 1, in which a third film is used, on which the structures are arranged in a patterned layer, wherein the third film is brought into contact with the optoelectronic components by means of the relative movement and the patterned layer is transferred to the optoelectronic components in the process.

13. The method according to claim 1, wherein a second roller is used, which is moved relative to the auxiliary carrier.

14. The method according to claim 13, wherein the second roller is arranged relative to the first roller such that the auxiliary carrier with the optoelectronic components is led through between the first and second rollers.

15. The method according to claim 1, wherein a plurality of coupling-out structures for radiation emitted by the optoelectronic components are produced as the structures.

16. The method according to claim 15, wherein photonic crystals are produced as coupling-out structures on the optoelectronic components.

17. The method according to claim 15, wherein the multiplicity of optoelectronic components comprises a multiplicity of radiation-emitting optoelectronic components, wherein the active layer is provided for generating the radiation and is arranged between a first and a second semiconductor layer, and wherein the structures are produced such that the structures are arranged in a beam path of the radiation emitted by the optoelectronic components.

18. The method according to claim 1, in which thin-film semiconductor bodies are used as the optoelectronic components.

19. The method according to claim 1, in which the structures are produced as nanostructures.

20. The method according to claim 1, wherein the structures are formed on a side of at least one of the optoelectronic components facing away from the auxiliary carrier and are not formed through the at least one of the optoelectronic components to the auxiliary carrier.

21. The method according to claim 4, wherein the structures are formed only in the photoresist layer.

22. A method for producing structures on a multiplicity of optoelectronic components arranged on an auxiliary carrier, the method comprising the steps of:

carrying out a relative movement between a first roller and the auxiliary carrier, where the auxiliary carrier carries the multiplicity of optoelectronic components before and during the formation of the structures, each of the optoelectronic components having a photoresist layer and an active layer comprising an optoelectronic material;

exerting a pressure between the first roller and the auxiliary carrier to form the structures on the multiplicity of optoelectronic components wherein the structures are formed in the photoresist layer of each of the optoelectronic components; and removing the multiplicity of optoelectronic components from the auxiliary carrier.

23. A method for producing structures on a multiplicity of optoelectronic components arranged on an auxiliary carrier, the method comprising the steps of:

arranging a wafer assemblage on an auxiliary carrier before forming the structures, wherein the wafer assemblage comprises a plurality of optoelectronic components, each of the optoelectronic components having an active layer comprising an optoelectronic material;

carrying out a relative movement between a first roller and the auxiliary carrier; and exerting a pressure between the first roller and the auxiliary carrier to form the structures on the multiplicity of optoelectronic components.

24. The method of claim 23, wherein the optoelectronic components are singulated after forming the structures.

\* \* \* \* \*